United States Patent
Ziegler et al.

(10) Patent No.: US 10,333,015 B2
(45) Date of Patent: *Jun. 25, 2019

(54) SOLAR CELL ASSEMBLY I

(75) Inventors: Martin Ziegler, Freiburg (DE); Sascha Van Riesen, Freiburg (DE)

(73) Assignee: Saint-Augustin Canada Electric Inc., Saint-Augustin de Desmaurs, QC (CA)

( * ) Notice: Subject to any disclaimer, the term of this patent is extended or adjusted under 35 U.S.C. 154(b) by 245 days.

This patent is subject to a terminal disclaimer.

(21) Appl. No.: 13/575,277

(22) PCT Filed: Feb. 22, 2011

(86) PCT No.: PCT/EP2011/000840
§ 371 (c)(1),
(2), (4) Date: Jul. 25, 2012

(87) PCT Pub. No.: WO2011/104001
PCT Pub. Date: Sep. 1, 2011

(65) Prior Publication Data
US 2012/0298202 A1    Nov. 29, 2012

(30) Foreign Application Priority Data
Feb. 25, 2010 (EP) .................................... 10001965

(51) Int. Cl.
H01L 31/02    (2006.01)
H01L 31/044   (2014.01)
H01L 31/052   (2014.01)

(52) U.S. Cl.
CPC ...... H01L 31/052 (2013.01); H01L 31/02008 (2013.01); H01L 31/044 (2014.12);
(Continued)

(58) Field of Classification Search
CPC . H01L 31/0521; H01L 31/024; H01L 27/142; H01L 27/14; H01L 27/1422;
(Continued)

(56) References Cited

U.S. PATENT DOCUMENTS 3,973,996 A * 8/1976 Kennedy ............. H01L 31/0504
136/201
5,093,708 A * 3/1992 Solomon ....................... 257/700
(Continued)

FOREIGN PATENT DOCUMENTS

CN    101548394 A    9/2009
CN    101647125 A    2/2010
(Continued)

OTHER PUBLICATIONS

European Search Report and Search Opinion for European Application No. 10001965.2, dated Aug. 24, 2010, 5 pages.
(Continued)

*Primary Examiner* — Andrew J Golden
(74) *Attorney, Agent, or Firm* — TraskBritt

(57) ABSTRACT

The present invention relates to a solar cell assembly, comprising a solar cell attached to a bonding pad and a cooling substrate and wherein the bonding pad and the cooling substrate are joined to each other in a planar and flush manner such that the bonding pad and the cooling substrate are connected to each other in the form of a solid state connection. The invention further relates to a solar cell assembly that includes a solar cell attached to a bonding pad and a cooling substrate and wherein the bonding pad is attached on a surface of the cooling substrate such that the bonding pad and the cooling substrate are connected to each other in the form of a solid state connection. Also, a method for manufacture of such solar cell assemblies is provided.

9 Claims, 6 Drawing Sheets

(52) U.S. Cl.
CPC .............. *H01L 2224/48091* (2013.01); *H01L 2224/48137* (2013.01); *H01L 2224/73265* (2013.01); *Y02E 10/50* (2013.01)

(58) Field of Classification Search
CPC .............. H01L 31/1876; H01L 31/188; H01L 31/1892; H01L 31/052; H01L 25/041; H01L 25/042; H01L 31/0525; H01L 31/0508; H01L 31/0504; H01L 31/047; H01L 31/0475; H01L 31/044; H01L 31/02008; H01L 31/042
USPC ................................... 136/243–265; 438/98
See application file for complete search history.

(56) References Cited

U.S. PATENT DOCUMENTS

| | | | | |
|---|---|---|---|---|
| 5,118,361 | A | 6/1992 | Fraas et al. | 136/246 |
| 5,642,261 | A * | 6/1997 | Bond | H01L 23/3128 |
| | | | | 257/707 |
| 6,395,972 | B1 | 5/2002 | Tran et al. | 136/251 |
| 6,417,575 | B2 * | 7/2002 | Harada et al. | 257/784 |
| 7,064,450 | B1 * | 6/2006 | Eghan et al. | 257/786 |
| 7,977,567 | B2 * | 7/2011 | Bett et al. | 136/244 |
| 2002/0140079 | A1 | 10/2002 | Takeyama | 257/698 |
| 2002/0148497 | A1 * | 10/2002 | Sasaoka | F24J 2/067 |
| | | | | 136/243 |
| 2002/0167064 | A1 | 11/2002 | Takeyama | 257/459 |
| 2007/0182005 | A1 * | 8/2007 | Cho | H01L 23/3192 |
| | | | | 257/734 |
| 2008/0041437 | A1 * | 2/2008 | Yamaguchi | 136/244 |
| 2008/0142073 | A1 * | 6/2008 | Sheats et al. | 136/252 |
| 2009/0159122 | A1 * | 6/2009 | Shook | H01L 31/048 |
| | | | | 136/256 |
| 2009/0242023 | A1 * | 10/2009 | Halfon et al. | 136/256 |
| 2009/0272427 | A1 * | 11/2009 | Bett et al. | 136/249 |
| 2010/0051085 | A1 * | 3/2010 | Weidman et al. | 136/244 |
| 2010/0089435 | A1 | 4/2010 | Lockenoff | 136/246 |
| 2010/0326492 | A1 * | 12/2010 | Tan | H01L 31/0508 |
| | | | | 136/246 |
| 2011/0048501 | A1 | 3/2011 | Jaus et al. | 136/246 |

FOREIGN PATENT DOCUMENTS

| | | |
|---|---|---|
| DE | 10 2007 011 403 A1 | 9/2008 |
| DE | 10 2007 00103 A1 | 9/2008 |
| EP | 2 119 863 A1 | 10/2009 |

OTHER PUBLICATIONS

International Preliminary Report on Patentability for International Application No. PCT/EP2011/000840, dated Aug. 28, 2012, 6 pages.
International Written Opinion for International Application No. PCT/EP2011/000840, dated Jul. 1, 2011, 5 pages.
Chinese Office Action for Chinese Application No. 201180010518.8 dated Jul. 3, 2014, 16 pages.
Chinese Office Action for Chinese Application No. 201180010518.8 dated Feb. 28, 2015, 15 pages.
Chinese Office Action for Chinese Application No. 201180010518.8 dated Aug. 12, 2015, 15 pages.
Korean Office Action for Application No. 10-2012-7020734 dated Oct. 31, 2013, 6 pages.

* cited by examiner

SOLAR CELL ASSEMBLY I

CROSS-REFERENCE TO RELATED APPLICATIONS

This application is a national phase entry under 35 U.S.C. § 371 of International Patent Application PCT/EP2011/000840, filed Feb. 22, 2011, designating the United States of America and published in English as International Patent Publication WO 2011/104001 A1 on Sep. 1, 2011, which claims the benefit under Article 8 of the Patent Cooperation Treaty and under 35 U.S.C. § 119(e) to European Patent Application Serial No. 10001965.2, filed Feb. 25, 2010, the disclosure of each of which is hereby incorporated herein in its entirety by this reference.

FIELD OF THE INVENTION

The present invention relates to a solar cell assembly and the manufacture of the same, and, particularly, the invention relates to a solar cell assembly comprising a cooling substrate and a bonding pad for the attachment of a solar cell.

BACKGROUND OF THE INVENTION

Photovoltaic or solar cells are designed for converting the solar radiation to electrical current. In concentrator solar photovoltaic applications the incoming sun light is optically concentrated before it is directed to solar cells. For example, the incoming sun light is received by a primary mirror that reflects the received radiation toward a secondary mirror that, in turn, reflects the radiation toward a solar cell, which converts the concentrated radiation to electrical current by the generation of electron-hole pairs in III-V semiconductor or single crystal silicon, for example.

The solar cell comprises a semiconductor integrated circuit die and therefore requires some manner of integrated circuit package or solar cell assembly, wherein the solar cell is connected to one or more functional devices. The solar cell assembly (SCA) may particularly provide environmental protection, heat dissipation and electrical connectivity to the solar cell.

In the art, SCAs are manufactured on a continuous single substrate base or comprise multiple components that are electrically isolated from each other. A critical issue is the back side contacting of the solar cell with the substrate of the SCA. Conventionally, a continuous single substrate functioning as a cooling substrate is contacted to the back side of a solar cell by means of selective noble metal (e.g., gold) deposition that represents a tedious and time-consuming, as well as expensive processing step.

In relation to the solar cell a big cooling area is needed, what stands in contrast to a fast and therefore cheap processing of the substrate. The provision of a number of electrically isolating material elements results in poor thermal conductivity and, thus, an inefficient overall thermal connection of the solar cell. Moreover, provision of materials of different material characteristics implies higher expenses and a plurality of connection regions and, therefore, may result in a significant deterioration of the (long-life) reliability of the manufactured SCA due to galvanic elements or thermo-mechanic stress.

Thus, despite the recent engineering progress there is still a need for providing an SCA that shows reliable electric contacting, efficient thermal conductivity and resistance against aging without increasing costs and, moreover, taking into account production rationalization.

SUMMARY OF THE INVENTION

The present invention addresses the above-mentioned need and, accordingly, provides a method for the manufacture of a solar cell assembly (SCA) comprising the steps of:
providing a solar cell and a bonding pad for bonding of the solar cell;
providing a cooling substrate; and
connecting the bonding pad to the cooling substrate in the form of a solid state connection.

In particular, the bonding pad can be joined to the cooling substrate in a planar and flush manner such that the bonding pad and the cooling substrate are connected to each other in the form of a solid state connection. Joining in a planar manner refers to planarity with respect to at least one surface. In fact, the bonding pad can be thicker than the cooling substrate. In this application the term "bonding pad" is used in the general meaning of a flat surface of an electrically conductive material intended to make electrical contact with a device.

Thus, according to the present invention a solid state connection without other materials/material layers/insulation layers between the bonding pad and the cooling substrate at the contact regions of the both is provided. Planar joining of the bonding pad and the cooling substrate means that the bonding pad is not provided atop of the cooling substrate. Particularly, at least one surface of the bonding pad whereupon the solar cell is positioned can be arranged flush with the corresponding surface of the cooling substrate such that these surfaces are arranged in-plane. Preferably, the flush surface corresponds to the surface of the cooling substrate that will be positioned (glued) on the final substrate, like, for instance, a glass backplane, and opposite to the surface on which the solar cell is bonded.

By the direct solid state connection, the need for additional adhesive means is avoided, thereby facilitating the overall processing and reducing the overall number of different elements employed in the SCA. Consequently, the reliability and lifetime of the SCA is significantly enhanced as compared to the art. The risk of forming galvanic elements that can significantly deteriorate the performance of the SCA is reduced. Moreover, the direct solid state connection allows for a good thermal and electrical connection between the bonding pad and the cooling substrate without the need for additional expensive contact materials needed in the art. By the solid state connection, production costs can be reduced and automated production is facilitated. Moreover, long term reliability is guaranteed.

The bonding pad and the cooling substrate may be provided with corresponding chamfers or bevelled edges to facilitate joining of the bonding pad to the cooling substrate, in particular, by laser welding. Corresponding chamfers provided for the bonding pad and the cooling substrate, respectively, allows for tolerances with respect to positioning of these elements before connection since the bevelled edges already aid in positioning of the same.

According to an alternative embodiment, the bonding pad and the cooling substrate are not connected in a planar flush manner but the bonding pad is attached on a surface of the cooling substrate. Thus, the above-mentioned need is also addressed by the method for the manufacture of a solar cell assembly according to claim 3 that comprises the steps of:
providing a solar cell and a bonding pad for bonding of the solar cell;

providing a cooling substrate; and
attaching or joining the bonding pad on a surface of the cooling substrate such that the bonding pad and the cooling substrate are connected to each other in the form of a solid state connection.

Again, by the direct solid state connection the need for additional adhesive means is avoided and the risk of forming galvanic elements that significantly deteriorate the performance of the SCA is reduced.

In both alternatives, the bonding pad and the cooling substrate can be connected to each other by laser welding, ultrasonic welding, resistance welding, sintering, thermocompression bonding, compression bonding or clinching, for example, or another process to form a solid state connection. Thereby, a solid state connection of the cooling substrate and the bonding pad can readily and reliably be obtained.

Any of the above-described examples may also include the processing step of forming a contacting surface on a part of the bonding pad and attaching the solar cell to the contacting surface. The solar cell may be contacted to the contacting surface by means of a thermally and/or electrically conductive adhesive or solder.

The bonding pad in the above-described embodiments may be provided in a geometric shape that (in a top view) comprises a superposition of a tetragon and an octagon such that one of two parallel sides of the octagon that are equally sized and longer than each of the other six sides of the octagon (that maybe equally sized) is superposed with one of two equally sized parallel sides of the tetragon that are longer than the other two parallel equally sized sides of the tetragon. The other one of the equally sized parallel sides of the tetragon does not lie within the shape of the octagon.

According to an alternative embodiment, the bonding pad in the above-described embodiments may be provided in a geometric shape that (in a top view) comprises a superposition of two trapezoids (e.g., isosceles trapezoids) and a tetragon wherein the longer one of the sides of the upper trapezoid (isosceles trapezoid) that are perpendicular to the symmetry axis of the upper trapezoid (isosceles trapezoid) is superposed on an upper side of the tetragon that is larger than that side (i.e., the longer one of the sides of the upper trapezoid (isosceles trapezoid) that are perpendicular to the symmetry axis of the upper trapezoid (isosceles trapezoid)) and the longer one of the sides of the lower trapezoid (isosceles trapezoid) that are perpendicular to the symmetry axis of the lower trapezoid (isosceles trapezoid) is superposed on the lower side of the tetragon that is larger than that side (the longer one of the sides of the lower trapezoid (isosceles trapezoid) that are perpendicular to the symmetry axis of the lower isosceles trapezoid). The two trapezoids (isosceles trapezoids) are superposed on the tetragon such that the smaller sides parallel to the ones superposed on the respective sides of the tetragon do not lie within the shape of the tetragon.

In both alternative embodiments the bonding pad is integrally formed in one single piece of these geometric shapes. Particular examples of the shapes are illustrated in FIGS. 6a and 6b as well as FIGS. 7a and 7b.

These geometric shapes are particularly useful for the arrangement of an SCA comprising the cooling substrate, the bonding pad and the solar cell. Moreover, these geometric shapes facilitate dense arrangement of multiple bonding pads in leadframes (see detailed description below).

The present invention also provides a solar cell assembly, comprising:
a solar cell attached to a bonding pad; and
a cooling substrate;
wherein the bonding pad and the cooling substrate are connected to each other in the form of a solid state connection (without any bonding/insulation material provided for the connection of the bonding pad and the cooling substrate).

In a particular embodiment wherein the bonding pad and the cooling substrate are joined to each other in a planar and flush manner such that the bonding pad and the cooling substrate are connected to each other in the form of a solid state connection. Joining in a planar manner refers to planarity with respect to at least one surface. In fact, the bonding pad can be thicker than the cooling substrate.

According to an alternative embodiment, provided is a solar cell assembly, comprising:
a solar cell attached to a bonding pad; and
a cooling substrate;
wherein the bonding pad is attached on a surface of the cooling substrate such that the bonding pad and the cooling substrate are connected to each other in the form of a solid state connection (without any bonding/insulation material provided for the connection of the bonding pad and the cooling substrate).

In these alternative embodiments of the inventive solar cell assembly (SCA) the bonding pad may exhibit a geometric shape that (in a top view):
either comprises a superposition of a tetragon and an octagon such that one of two parallel sides of the octagon that are equally sized and longer than each of the other six sides of the octagon is superposed with one of two equally sized parallel sides of the tetragon that are longer than the other two parallel equally sized sides of the tetragon;
or a superposition of two trapezoids (isosceles trapezoids) and a tetragon wherein the longer one of the sides of the upper trapezoid (isosceles trapezoid) that are perpendicular to the symmetry axis of the upper trapezoid (isosceles trapezoid) is superposed on an upper side of the tetragon that is larger than that side and the longer one of the sides of the lower trapezoid (isosceles trapezoid) that are perpendicular to the symmetry axis of the lower trapezoid (isosceles trapezoid) is superposed on the lower side of the tetragon that is larger than that side.

Again, the other one of the equally sized parallel sides of the tetragon does not lie within the shape of the octagon and the two trapezoids (isosceles trapezoids) are superposed on the tetragon such that the smaller sides parallel to the ones superposed on the respective sides of the tetragon do not lie within the shape of the tetragon.

Alternatively, the bonding pad may exhibit a geometric shape that (in a top view) is given by a hexagon or a rectangle.

Moreover, the SCAs according to the present invention may include an electrical device or any device with a conductive surface insulated against the cooling substrate (for example, an aluminum pad) connected to a surface of the solar cell by wires and positioned on a region of the bonding pad. Alternatively, the electrical device or the aluminum pad may be positioned on the cooling substrate. The electrical device may, for example, be a bypass diode.

The present invention also separately provides a bonding pad with the geometric shape specified above and particularly a bonding pad with the geometric shape as illustrated in FIGS. 6a and 6b (see detailed discussion below).

The bonding pad may comprise a contact surface covering completely or partly the bonding pad. The contact surface may particularly consist of a material that is suitable for contacting the back side of a solar cell that is to be attached to the bonding pad. For example, the contact surface may consist of a plating of noble metals (e.g., gold, silver) or non-noble metals (e.g., copper, tin, nickel or nickel-phosphorous). In particular, an electro-plated layer of a noble metal (e.g., gold, silver) or a non-noble metal (e.g., copper, tin, nickel or nickel-phosphorous) can be provided as the contact surface. The above-described SCAs may include such a bonding pad comprising the contact surface. In addition, a leadframe is provided comprising a plurality of the above-described bonding pads, wherein the bonding pads are densely packed in one plane. In particular, the leadframe may comprise the arrangement of bonding pads as illustrated in FIG. 5. Such a leadframe allows for very efficient processing by standard semiconductor technology.

In all of the above exemplary methods and devices the bonding pad and/or the cooling substrate may comprise or consist of an aluminum alloy, in particular, of a 99.5% aluminum alloy.

BRIEF DESCRIPTION OF THE INVENTION

Additional features and advantages of the present invention will be described with reference to the drawings. In the description, reference is made to the accompanying figures that are meant to illustrate preferred embodiments of the invention. It is understood that such embodiments do not represent the full scope of the invention.

DETAILED DESCRIPTION OF THE INVENTION

Figure 1A:
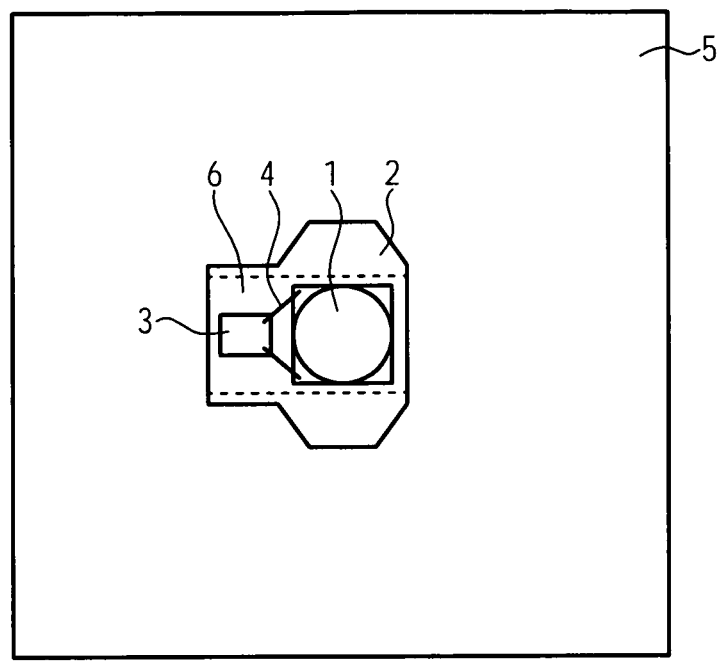
FIGS. 1a and 1b illustrate an example of an SCA comprising a cooling substrate, a bonding pad, a solar cell and an electrical device contacted with the solar cell according to the invention.
Figure 1B:
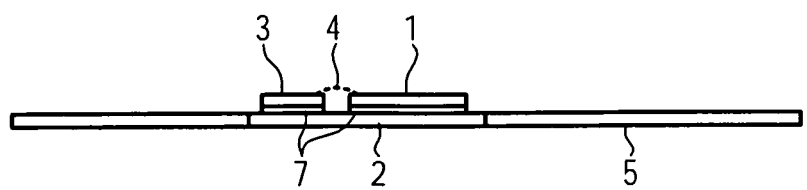

An SCA configuration manufactured in accordance with the present invention is illustrated in FIGS. 1a (top view) and 1b (side view). The SCA comprises a cooling substrate 5 and a bonding pad 2 planar joined to the cooling substrate 5. As can be seen in FIG. 1b the bonding pad 2 is flush with the cooling substrate 5 with no (particularly, no insulating) material between them. In fact, the bonding pad 2 and the cooling substrate 5 are subject to a solid state bond, thereby providing a reliable long-term durable connection unprecedented in the art. It is preferred that the bonding pad 2 and the cooling substrate 5 are made of the same material. According to an example this material is an aluminum alloy, in particular, a 99.5% aluminum alloy. Thermal stresses and galvanic elements between the bonding pad 2 and the cooling substrate 5 are avoided by the choice of the same material.

In principle, the cooling substrate 5 consists of a plane metal and shall provide thermal cooling and may also serve as an electric conductor. The dimensions and, particularly, the thickness of the plane metal (as the thickness of the bonding pad 2) can be selected in accordance with the desired cooling performance. The choice of a 99.5% aluminum alloy for the cooling substrate 5 allows for reliably contacting to thin-wire or thick-wire or ribbon bond connections as well as connecting to a secondary optics of a concentrator solar photovoltaic application made of aluminium.

Figure 2:
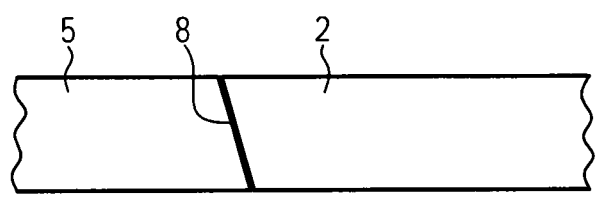
FIG. 2 illustrates a side view of the bevelled edges of the bonding pad and cooling substrate. The bonding pad is positioned in the cooling substrate.

The bonding pad 2 and the cooling substrate 5 can be joined together by laser welding, ultrasonic welding, resistance welding, sintering, thermo-compression bonding, or clinching, etc. Particularly in the case of laser welding, the bonding pad 2 and the cooling substrate 5 are advantageously provided with respective chamfers/bevelled edges 8 as shown in FIG. 2 in order to facilitate the handling and connection and to allow for some tolerances with respect to the positioning of the bonding pad 2 and the cooling substrate 5 before joining them to each other with an upper surface of the cooling substrate 5 arranged in-plane with the upper surface of the bonding pad 2 if both elements have the same thickness, for example.

Alternatively, it may be preferred to provide the bonding pad 2 with a larger thickness than the cooling substrate 5 in order to achieve some more efficient cooling by the bonding pad 2. In this case, at least one of the upper surface of the bonding pad 2 (whereupon the solar cell 1 is arranged) and the lower surface of the bonding pad 2 is positioned higher than the respective surface of the cooling substrate 5. This has the further advantage that no alloys between the plated material and the cooling substrate material are formed. Thus, the long-term durability is further increased.

The bonding pad 2 shows a geometric shape that facilitates thermal cooling and may comprise a portion that is appropriate for positioning a device 3, for example, a bypass diode or an electrically isolated contact pad, to be electrically contacted with the upper surface of the solar cell 1 by means of bonding wires 4. In the shown example (see FIG. 1a) the bonding pad 2 has a shape of an octagon superimposed by a tetragon such that one of two parallel sides (the left one on FIG. 1a) of the octagon that are equally sized and longer than each of the other six sides of the octagon is superposed with one of two equally sized parallel sides of the tetragon (the right one in FIG. 1a) that are longer than the other two parallel equally sized sides. The bonding pad 2 is integrally formed of these geometric shapes.

Furthermore, the bonding pad 2 comprises a contact surface 6 covering partly the bonding pad 2. The contact surface 6 consists of a material that is suitable for contacting the back side of the solar cell 1. For example, the contact surface 6 may consist of a plating of a noble metal (e.g., gold, silver) or a non-noble metal (e.g., copper, tin or nickel-phosphorous). In particular, an electro-plated layer of a noble metal (gold, silver) or a non-noble metal (e.g., copper, tin or nickel-phosphorous) can be provided as the contact surface 6. The contact surface 6 can particularly be provided in a rectangular shape. Alternatively, the solar cell 1 may be directly connected to the aluminium bonding pad 2. Contacting of the solar cell 1 with the bonding pad 2 can be realized by means of a solder 7 or thermally and/or electrically conductive adhesive 7 as it is shown in FIG. 1b.

According to the present example, device 3 is similarly contacted by the solder 7 or conductive adhesive 7 to the bonding pad 2.

According to a particular embodiment, at least one of the bonding pad 2 and the cooling substrate 5 consists of a 99.5% aluminum alloy and the bonding pad 2 comprises a galvanic layer or plating with an exposed silver surface at the top. On the silver surface, a conductive silver adhesive is formed for electrical and thermal connection with the back side of the solar cell 1. The same conductive silver adhesive is used for the electrical and thermal connection of the bonding pad 2 and device 3.

Figure 3A:
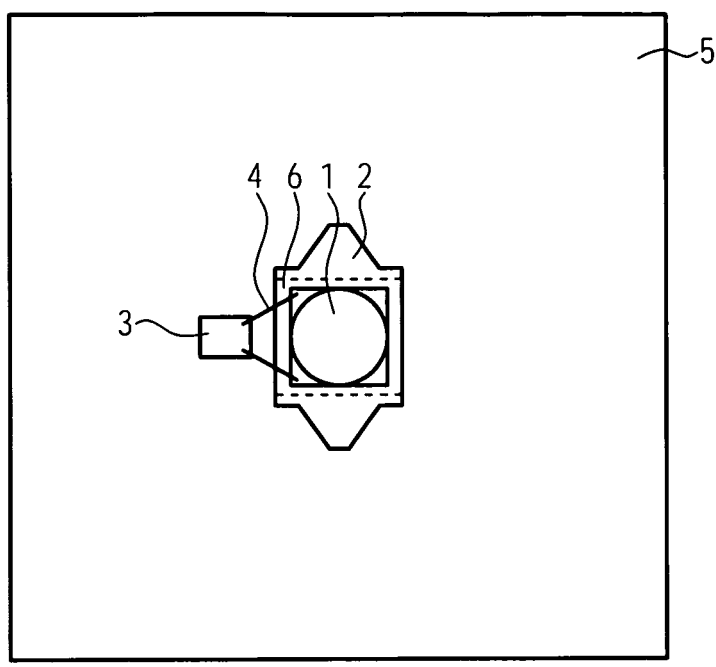
FIGS. 3a and 3b illustrate another example of an SCA comprising a cooling substrate, a bonding pad, a solar cell and an electrical device contacted with the solar cell according to the invention.
Figure 3B:
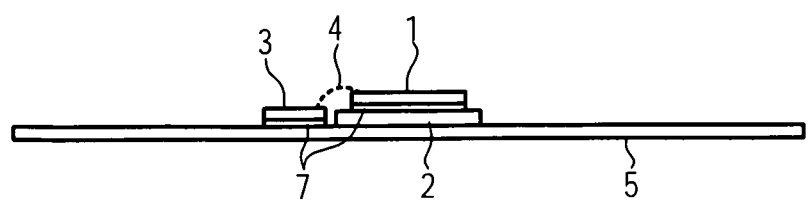

FIGS. 3a and 3b illustrate another embodiment of an SCA comprising a cooling substrate, a bonding pad, a solar cell and an electrical device contacted with the solar cell according to the invention. As compared to the example shown in FIGS. 1a and 1b, the bonding pad 2 has a different shape and does not include a portion for positioning device 3 that is connected to the upper surface of the solar cell 1 by bonding wires 4.

The bonding pad shown in FIG. 3a is shaped in the form of a polygon with twelve corners and sides. In detail, the shape of the bonding pad 2 is given by a superposition of two (isosceles) trapezoids and a tetragon. The longer one of the sides of the upper (isosceles) trapezoid that are perpendicular to the symmetry axis of the upper (isosceles) trapezoid is superposed on an upper side of the tetragon that is larger than that side. Similarly, the upper longer one of the sides of the lower (isosceles) trapezoid that are perpendicular to the symmetry axis of the lower (isosceles) trapezoid is superposed on the lower side of the tetragon (parallel to the upper side of the tetragon) that is larger than that side (see FIG. 3a).

As in the example described with reference to FIGS. 1a and 1b, the bonding pad 2 comprises a contact surface 6 covering partly the bonding pad 2. The contact surface 6 is rectangular-shaped and consists of a material that is suitable for contacting the back side of the solar cell 1, for example, gold, silver, copper, tin or nickel-phosphorous. The solar cell 1 is contacted with the bonding pad via a solder 7 or thermally and/or electrically conductive adhesive 7. The device 3 is positioned spaced apart from the bonding pad 2 and it is contacted with the cooling substrate 5 via another solder 7 or thermally and/or electrically conductive adhesive 7 of the same or a different material as the one used for contacting the solar cell 1 with the bonding pad 2 (FIG. 3b).

Different from the embodiment shown in FIGS. 1a and 1b, in the example shown in FIGS. 3a and 3b the bonding pad 2 is not joint planar and flush to the cooling substrate 5 but rather it is attached atop of the cooling substrate 5. Again, however, no other material, particularly, no additional insulation layer, is provided between the bonding pad 2 and the cooling substrate 5 but the bonding pad 2 is directly welded on the surface of the cooling substrate 5 by means of laser welding, for example.

Whereas the bonding pad 2 of the example shown in FIGS. 3a and 3b is provided on a surface of the cooling substrate 5, it should be noted that, alternatively, it could be joined with the cooling substrate 5 as it is described with respect to the bonding pad 2 of FIGS. 1a and 1b. Accordingly, the bonding pad 2 of FIGS. 1a and 1b could, alternatively, be attached to a surface of the cooling substrate 5 (atop of the cooling substrate 5) rather than joined planar and flush with the same.

Figure 4:
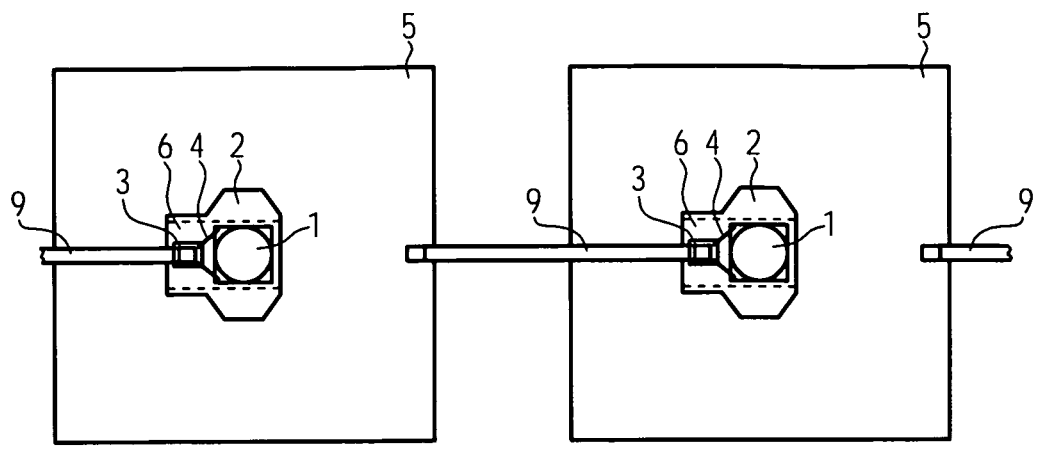
FIG. 4 illustrates thick-wire wiring of individual SCAs formed according to examples of the present invention.

In any case, individual SCAs according to the examples of FIGS. 1a and 1b or FIGS. 3a and 3b can be wired as it is shown in FIG. 4. Thick-wires 9, for example, aluminium wires, connect to the bonding pads 2 of the SCAs. A secondary optics or its mount made of aluminum can readily be connected to the cooling substrate 5 by means of laser welding, etc.

Fabrication of the bonding pads can be realized, for example, as follows. Rectangular pieces of aluminum (or a different metal) are provided. Stripes of noble or non-noble metal are formed on this rectangular piece of aluminum to form the future contact surfaces. Then, the bonding pads are formed by stamping, to form a so called "leadframe" 10 shown in FIG. 5. The position and shape of the pad are designed such that a very high density of bonding pad can be arranged on a single rectangular piece of aluminium, such that a single stamping step is sufficient to form the pad. Also, the bonding pads are designed and positioned such that the continuous stripes of noble or non-noble metal coated on the surface of the aluminium piece are appropriately positioned on the pad, after stamping, for receiving the solar cell and possibly the diode.

Figure 5:
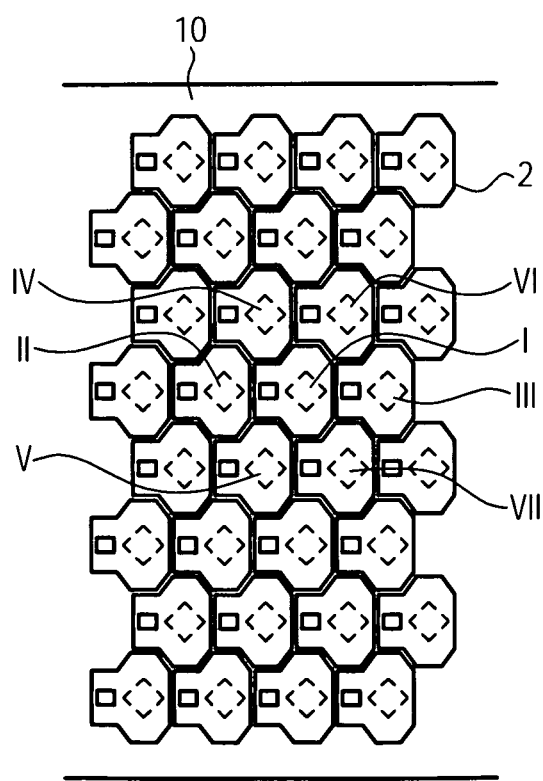
FIG. 5 illustrates a leadframe comprising bonding pads according to an example of the present invention.
Figure 6A:
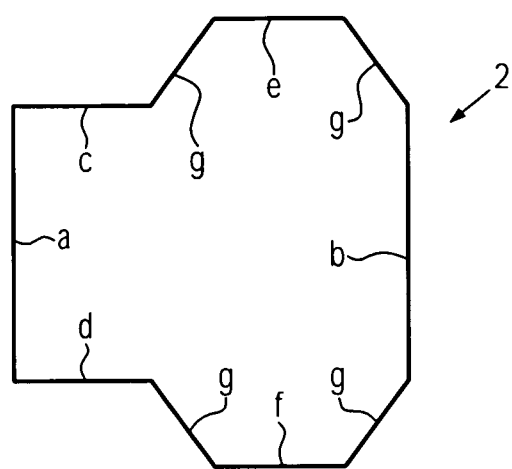
FIGS. 6a and 6b illustrate exemplary geometric shapes of bonding pads according to examples of the present invention.

The bonding pads 2 provided by the present invention are particularly suitable for mass production and processing by semiconductor technology. In FIG. 5 a leadframe comprising a plurality of bonding pads 2 is illustrated. The bonding pads 2 are densely and planar packed on a metal stripe of leadframe 10 that can be promoted in a production line. In the example shown, a plurality of bonding pads 2 described with reference to FIGS. 1a and 1b form the leadframe. The geometric shape of the bonding pads is also shown in FIG. 6a. The uppermost and lowermost bonding pads 2 and the leftmost and rightmost bonding pads 2 of FIG. 5 may be designated as boundary bonding pads. All bonding pads that are completely neighbored by other bonding pads are designated as inner bonding pads.

The inner bonding pads are arranged such that for each of these bonding pads I, the following holds:

A) A long side (indicated by a in FIG. 6a) of the rectangle of the bonding pad I (being parallel to a long side of the octagon of the same bonding pad) is positioned adjacent to a long side of the octagon of a first other bonding pad II and a long side (indicated by b in FIG. 6a) of the octagon of the same bonding pad I is positioned adjacent to a long side of the rectangle of second other bonding pad III.

B) A first short side (shorter than the long side and indicated by c in FIG. 6a) of the rectangle of the bonding pad I is positioned adjacent to a first short side of an octagon of a third other bonding pad IV and a second short side (indicated by d in FIG. 6a) parallel to the first short side of the rectangle of the bonding pad I is positioned adjacent to a first short side of an octagon of a fourth other bonding pad V.

C) A first short side (shorter than the long side and indicated by e in FIG. 6a) of the octagon of the bonding pad I is positioned adjacent to a first short side of the rectangle of a fifth other bonding pad VI and a second short side (parallel to the first one and indicated by f in FIG. 6a)) of the octagon of the bonding pad I is positioned adjacent to a first short side of the rectangle of a sixth other bonding pad VII.

D) The diagonal sides (indicated by g in FIG. 6a) of the octagon of the bonding pad I are adjacent to respective diagonal sides of the third to sixth octagons IV to VII as shown in FIG. 5.

Figure 6B:
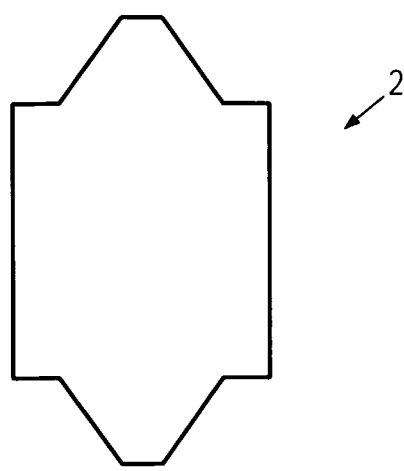

In a similar manner, the bonding pads described with reference to FIGS. 3a and 3b and as shown in FIG. 6b can be arranged in a dense arrangement. In a particular arrangement, diagonal sides of one bonding pad 2 illustrated in FIG.

6b are positioned adjacent to diagonal sides of other bonding pads 2 of the same shape in a leadframe comprising the bonding pads 2 shown in FIG. 6b.

The assembling of a bonding pad, a cooling substrate and a solar cell may comprise the following. The solar cells and possibly the diode are successively assembled on the bonding pad being part of the leadframe. Then, each bonding pad of the leadframe is "detached" and joined/attached to the cooling substrate. This is very preferable in terms of manufacturability, since the small elements (diode, solar cells) are picked and placed on the leadframe. This procedure can be performed in an automated industrial way with current equipment. However, care should be taken not to deteriorate those electronic components during the assembly of the bond pad with the cooling substrate. In this procedure, there is a need to pick-and-place the bond pad with its electronic component mounted on it. Therefore, the bond pad should exhibit some "handling area" that typically is not coated with a noble or non-noble metal. The handling area will allow the "pick-and-place" tool to manipulate the bond pad. Handling areas are defined by the sides indicated by e and g, and by f and g of FIG. 6a as well as by the trapezoid areas of FIG. 6b, also defined as handling areas.

Figure 7A:
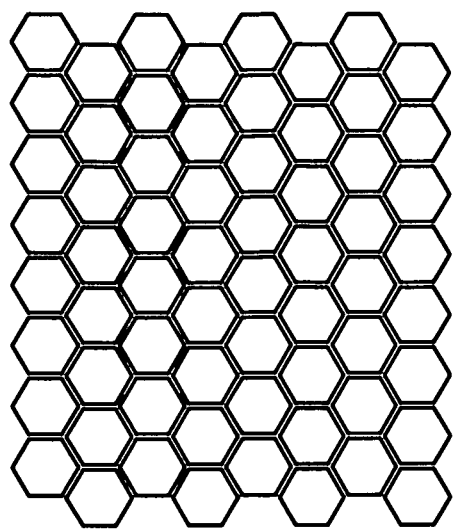
FIGS. 7a and 7b illustrate further exemplary geometric shapes of bonding pads arranged in leadframes according to examples of the present invention.
Figure 7B:
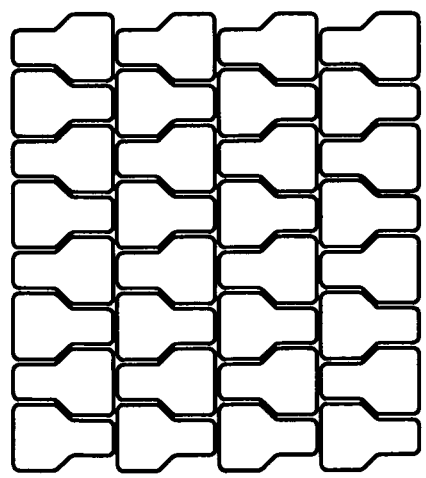

Further alternative appropriate shapes of the inventive bonding pad 2 (FIGS. 1a and 1b) and arrangements of the same in a leadframe are illustrated in FIGS. 7a and 7b. Compared with the geometric shapes of the above-described bonding pads, the shapes of the bonding pads shown in FIGS. 7a (hexagon) and 7b (two rectangles) are simpler. No particular handling area is defined. In this case, the dimensions of the bonding pad can be reduced and manufacture of the bonding pad is cheaper. Such bonding pads are particularly useful for the following procedure of assembling the bonding pad, the cooling substrate and the solar cell. In a first step, the bonding pad is assembled on the cooling substrate. In a second step, the solar cell and possibly the diode are connected to the bonding pad. However, the manufacture is less easy (in terms of automation) as compared to the above-described method of assembly, because the devices are to be positioned on rather large substrates (cooling substrate and bonding pad).

All previously discussed embodiments are not intended as limitations but serve as examples illustrating features and advantages of the invention. It is to be understood that some or all of the above described features can also be combined in different ways.

What is claimed is:

1. A method for the manufacture of a photovoltaic device including a plurality of solar cell assemblies, the method comprising:
    forming a plurality of solar cell assemblies, comprising:
        providing a leadframe including bonding pads for bonding solar cells, wherein the leadframe and bonding pads comprise integral portions of a sheet of metal;
        bonding solar cells onto the bonding pads while the bonding pads remain part of the leadframe, the solar cells being electrically and thermally coupled to the bonding pads; and
        after bonding the solar cells onto the bonding pads, separating the bonded solar cells and bonding pads from the leadframe and respectively connecting the bonding pads to cooling substrates such that a solid state connection is established between the bonding pads and the cooling substrates, the cooling substrates comprising metal plates electrically and thermally coupled to the bonding pads, the metal plates being larger than the bonding pads; and
    attaching the plurality of solar cell assemblies to a final substrate; and
    wherein connecting the bonding pads to cooling substrates comprises directly contacting the bonding pads to the cooling substrates without an intermediate bonding material therebetween,
    wherein connecting the bonding pads to cooling substrates comprises joining the bonding pads to the cooling substrates such that lower surfaces of the bonding pads are co-planar and flush with lower surfaces of the cooling substrates and upper surfaces of the bonding pads are co-planar and flush with upper surfaces of the cooling substrates to which they are respectively connected.

2. The method according to claim 1, wherein the solid state connection between the bonding pads to cooling substrate is attained by laser welding, ultrasonic welding, resistance welding, sintering, thermo-compression bonding, compression bonding or clinching the bonding pads and the cooling substrates together.

3. The method according to claim 1, further comprising providing corresponding chamfers or bevelled edges on the bonding pads and the cooling substrates.

4. The method according to claim 1, which further comprises forming a contacting surface on at least a part of the bonding pad attaching a solar cell to the contacting surface.

5. The method according to claim 4, wherein the solar cells are attached to the bonding pads by a thermally or electrically conductive adhesive or solder.

6. The method according to claim 4, wherein bonding the solar cells onto the bonding pads comprises joining each of the solar cells to the contact surface using a conductive adhesive or solder.

7. The method according to claim 1, wherein each of the bonding pads is provided with a geometric shape that comprises a superposition of a tetragon and an octagon such that one of two parallel sides of the octagon that are equally sized and longer than each of the other six sides of the octagon is superposed with one of two equally sized parallel sides of the tetragon that are longer than the other two parallel equally sized sides of the tetragon, and wherein no area bounded by the tetragon is superimposed over any area bounded by the octagon.

8. The method according to claim 1, wherein each of the bonding pads is provided with a geometric shape that comprises a superposition of upper and lower trapezoids and a tetragon wherein one of the sides of the upper trapezoid that is perpendicular to the symmetry axis of that trapezoid is superposed on a side of the tetragon that is larger than that side of the upper trapezoid and one of the sides of the lower trapezoid that is perpendicular to the symmetry axis of the lower trapezoid is longer than its other sides and is superposed on the lower side of the tetragon that is larger than that side of the lower trapezoid.

9. The method according to claim 1, wherein each of the bonding pads is provided with a geometric shape that comprises a hexagon or a rectangle.

* * * * *

UNITED STATES PATENT AND TRADEMARK OFFICE
CERTIFICATE OF CORRECTION

| | |
|---|---|
| PATENT NO. | : 10,333,015 B2 |
| APPLICATION NO. | : 13/575277 |
| DATED | : June 25, 2019 |
| INVENTOR(S) | : Martin Ziegler and Sascha Van Riesen |

Page 1 of 1

It is certified that error appears in the above-identified patent and that said Letters Patent is hereby corrected as shown below:

In the Specification

Column 8, Line 57, change "indicated by fin" to --indicated by f in--

Signed and Sealed this
Twenty-seventh Day of August, 2019

Andrei Iancu
*Director of the United States Patent and Trademark Office*